United States Patent
Avron et al.

(10) Patent No.: US 10,719,637 B2
(45) Date of Patent: Jul. 21, 2020

(54) GLOBALLY CONVERGENT SYSTEM AND METHOD FOR AUTOMATED MODEL DISCOVERY

(71) Applicant: INTERNATIONAL BUSINESS MACHINES CORPORATION, Armonk, NY (US)

(72) Inventors: Haim Avron, White Plains, NY (US); Lior Horesh, North Salem, NY (US); Leo S. Liberti, Paris (FR); David Nahamoo, Great Neck, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 799 days.

(21) Appl. No.: 14/755,942

(22) Filed: Jun. 30, 2015

(65) Prior Publication Data
US 2017/0004231 A1    Jan. 5, 2017

(51) Int. Cl.
*G06F 30/20*    (2020.01)
*G06F 17/10*    (2006.01)

(52) U.S. Cl.
CPC .............. *G06F 30/20* (2020.01); *G06F 17/10* (2013.01)

(58) Field of Classification Search
CPC ............................. G06F 17/10; G06F 17/5009
See application file for complete search history.

(56) References Cited

U.S. PATENT DOCUMENTS

| | | | |
|---|---|---|---|
| 7,043,462 B2 * | 5/2006 | Jin | G06N 3/126 706/13 |
| 8,818,932 B2 | 8/2014 | Nolan et al. | |
| 2004/0019469 A1 * | 1/2004 | Leary | G05B 17/02 703/2 |

OTHER PUBLICATIONS

Provan, Gregory M., and Alexander Feldman. "A Framework for Assessing Diagnostics Model Fidelity." In DX@ Safeprocess, pp. 127-134. 2015. (Year: 2015).*

(Continued)

*Primary Examiner* — Aniss Chad
(74) *Attorney, Agent, or Firm* — Tutunjian & Bitetto, P.C.; Anthony Curro

(57) ABSTRACT

Methods and systems for model discovery include forming a mathematical program based on a set of observational data to generate an objective function and one or more constraints. The mathematical program represents a model space as an expression tree comprising operators and operands. The mathematical program is solved by optimizing the objective function subject to the one or more constraints to determine a model in the model space that best fits the set of observational data.

3 Claims, 3 Drawing Sheets

(56) References Cited

OTHER PUBLICATIONS

Gleckler, Peter J., Karl E. Taylor, and Charles Doutriaux. "Performance metrics for climate models." Journal of Geophysical Research: Atmospheres 113, No. D6 (2008). (Year: 2008).*
Majda, Andrew J., and Boris Gershgorin. "Improving model fidelity and sensitivity for complex systems through empirical information theory." Proceedings of the National Academy of Sciences 108, No. 25 (2011): 10044-10049. (Year: 2011).*
Torres Sa Barretto, Real time updating methodology for mathematical models of decision making process, Carlos Arthur et al, 20th International Congress of Mechanical Engineering, Nov. 15-20, 2009, pp. 1-10, BCM.
Hornik et al., Multilayer Feedforward Networks are Universal Approximators, Neural Networks, Jun. 1989, pp. 359-366, vol. 2.
Kurkova, Kolmogorov's Theorem and Multilayer Neural Networks, Nov.-Dec. 1992, pp. 501-506, vol. 5, Issue 3.
Schmidt, Distilling Free-Form Natural Laws from Experimental Data, Science, Apr. 3, 2009, pp. 81-85, vol. 324.

* cited by examiner

GLOBALLY CONVERGENT SYSTEM AND METHOD FOR AUTOMATED MODEL DISCOVERY

BACKGROUND

Technical Field

The present invention relates to automatic model discovery and, more particularly, combining data-driven methods with primitives of first-principles based modeling to generate a mathematical model.

Description of the Related Art

Mathematical modeling provides a consistent link between the input and output of a system or phenomenon under investigation. These models are used for various objectives such as description, prediction, and design, through a broad range of science and engineering disciplines, including physics, chemistry, biology, economics, etc. Historically, researchers and practitioners find consistent and generalized cause and effect links through experiment and formulate mathematical expressions that embody such relations. However, modeling complex phenomena, in particular while relying on a relatively small number of observations, is difficult to accomplish.

Traditionally the formulation of mathematical models is attempted through first principles formulations, using modeling primitives such as differential operators and integral equations. Such an approach benefits from great generality in the governing relations, but identification of an appropriate formulation is non-trivial. Such an approach usually relies on human intuition and the frequently tedious comparison of predictions with experimental observations.

At the other extreme, modeling can be performed using data driven approaches that use generic statistical models, assuming that a sufficient amount of input data is provided. Statistical models may be limited in their generalizability and, depending on the capacity and complexity of the predictive relation in the prescribed functional form, may require an intractably large set of examples to use as training data.

SUMMARY

A method for model discovery includes forming a mathematical program based on a set of observational data to generate an objective function and one or more constraints. The mathematical program represents a model space as an expression tree comprising operators and operands. The mathematical program is solved by optimizing the objective function subject to the one or more constraints to determine a model in the model space that best fits the set of observational data.

A method for model discovery includes forming a mathematical program based on a set of observational data to generate an objective function and at least one numerical and structural constraint represented by continuous and integer variables. The mathematical program represents a model space as an expression tree comprising operators and operands. The objective function is based on model complexity and on a fidelity of model predictions to observations. The mathematical program is solved by optimizing the objective function subject to the one or more constraints to determine a model in the model space that best fits the set of observational data.

A system for model discovery includes a mathematical program generation module comprising a processor configured to form a mathematical program based on a set of observational data to generate an objective function and one or more constraints. The mathematical program represents a model space as an expression tree comprising operators and operands. A solver is configured to solve the mathematical program by optimizing the objective function subject to the one or more constraints to determine a model in the model space that best fits the set of observational data.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Figure 1:
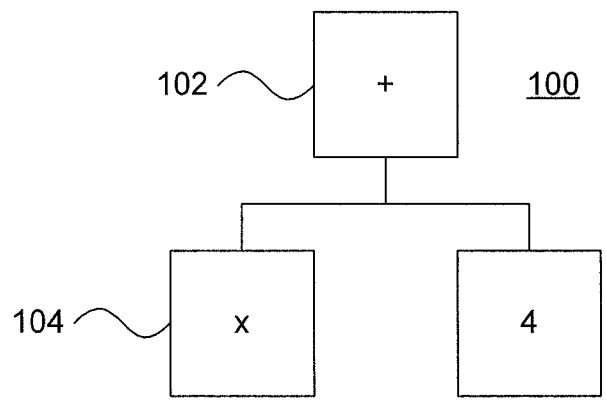
FIG. 1 is a diagram of an expression tree modeling a formula in accordance with the present principles.

Embodiments of the present principles provide a compromise between model fidelity and model complexity, devising both model functional form as well as its parameters while honing desired modeling goals. These goals may include, e.g., precision, universality, invariance, conservation, functional simplicity/description complexity, symmetry preservation, etc.

Unlike conventional data-driven model generation, which estimates parameters of a given functional form of a model, and unlike human first-principles modeling, the present embodiments provide automated discovery of both the model functional form as well as gauges and calibrates the parameters of the model. A data-driven approach is combined with primitives of first-principles-based modeling to provide a more universal model. The present embodiments therefore employ stochastic programming and mixed integer non-linear programming, where the former provides the statistical framework of the model and the latter provides simultaneous discovery of the functional form and the model parameters.

These embodiments provide model learning and discovery using relatively (compared to data-driven approaches) small amounts of data. This is due to the fact that a more flexible functional form of richer operand primitives is allowed, along with a stricter complexity requirement. The present embodiments also provide universality. By not restricting the model to any predefined functional form, and allowing a rich set of operators (as opposed to the highly structured and limited set data-driven conventional approaches), as well as by imposing structural preferences, the resulting models possess higher generalization capacity. For example, one limitation of data driven approaches is their poor ability to extrapolate beyond training data ranges. In addition, the attained models are more compact in their functional representation, making their interpretation more direct and intuitive to provide meaningful links between input and output.

To accomplish the above goals, the present embodiments find the simplest mathematical expression, over a certain alphabet including, e.g., the usual sum, difference, product, division, power, logarithm, exponential, sine, and cosine operators, which yields values which are as close as possible to a set of observations. This can be described by a mathematical program involving both continuous and integer variables, as well as linear and non-linear constraints.

The discrete integer variables enable description of the functional form of the mathematical model, as they can encode discrete choice between one alphabet entity or another at a given entry in the expression tree. The continuous counterparts of the discrete integer variables enable modeling coefficients and variables holding various continuous values.

A mathematical program is a formal sentence of a language which describes optimization problems. It includes the following entities: parameters (the program input data), decision variables (encoding the program output or solution), one or more objective functions, and constraints upon the decision variables. The objective function and constraints involve functional forms in terms of the parameters and decision variables. The task of model discovery is formulated herein as the construction of the mathematical program.

Referring now to FIG. 1, an exemplary mathematical expression 100 is shown. The mathematical expressions are represented as trees or "expression trees." These trees are combinatorial constructs including nodes 102 linked by arcs 104. The nodes are organized by rank, where the root node has rank zero and any subnode of a parent node has a rank one greater than the parent node's rank. In this way, the definition of rank is inductively extended over the entire tree. Since rank encodes a parent-child relationship between nodes, a tree cannot have any cycles (where a node might be its own ancestor). The nodes of the tree are labeled with operator names, such as "plus," "minus," etc. In the particular example of FIG. 1, the tree 100 encodes the mathematical expression x+4. The root node 102 is labeled by the '+' operator, the left subnode 104 is labeled by the 'x' variable name, while the right subnode 104 is labeled by the constant '4'.

Many different expressions are equivalent to this expression 100. For example 2(0.5x+2) is equivalent to x+4, which has a lower complexity. If the given data are a good fit for the function x+4, then the expression 100 will match the data. There are also multiple different expressions that have a minimum description complexity. For example, x+4 has the same complexity as 4+x. The mathematical program thereby implicitly describes all globally optimal expressions.

The number of nodes in the tree is minimized to ensure the global minimality of description complexity, subject to the fact that the trees are feasible if and only if they encode a mathematical expression which fits the data. The solution to the mathematical program is globally optimal with respect to description complexity, subject to a numerical discrepancy not exceeding a prescribed limit.

Figure 4:
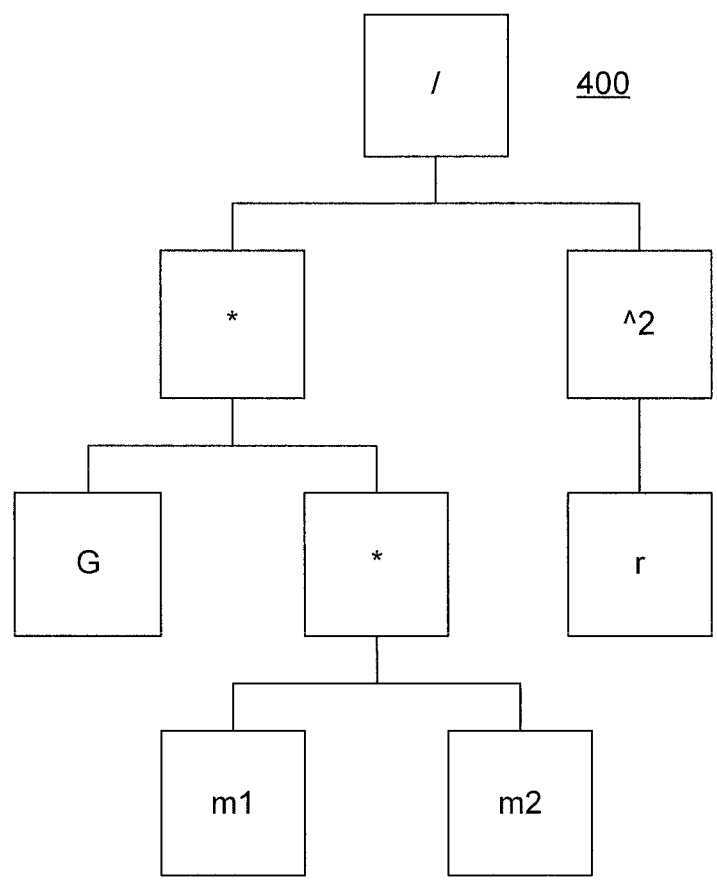
FIG. 4 is a diagram of an expression tree modeling a Newton's law of gravitation in accordance with the present principles.

Referring now to FIG. 4, a diagram of the expression tree for Newton's law of gravitation is shown in the tree 400. Newton's law of gravitation is written as $$F = \frac{G(m_1 m_2)}{r^2},$$

which can be readily represented as a tree of operators (e.g., multiplication, division, and squaring) and operands (e.g., G, r, m1, and m2).

A number of parameters will be used herein:

D represents the dimension of the Euclidean space embedding the observations.

H represents a set $\{H_1, H_2, \ldots, H_{max}\}$ of observation indices, each representing an observation point $(\chi^h|h\in H)$ at which a model $f$ is evaluated and an observation value $(f^h|h\in H)$ corresponding to the evaluation of $f$ at the observation points.

$\mu$ is a metric on $\mathbb{R}^{|H|}$ quantifying the discrepancy between measured and modeled output with an upper bound constant $\varepsilon > 0$, such that $\mu(f, \phi) \leq \varepsilon$, where $f = (f(\chi^h)|h\in H)$ and $\phi = (\phi^h|h\in H)$.

A represents a set of alphabet symbol indices, where the alphabet $\{\oplus_a, |a\in A\}$ of the formal language $\mathcal{L}$ includes mathematical operations of a given arity $K_a$ for each $a\in A$. Since many nodes can be labeled by the same operator symbol $\oplus_a$, the quantity $C_a$ is used to denote a maximum number of occurrences of the operator $\oplus_a$ in an expression. Every operator $\oplus_a$, aside from leaf operators L={var, coef}, has a given number of $K_a$ operands. An exemplary alphabet A may include the operators coef, var, +, −, *, /, ^2, ^, exp, log, sin, and cos.

V represents a set $\{(a, i)|a\in A, i\leq C_a\}$ of all potential nodes in the problem.

T represents the expression tree formed from a set of nodes N. A model finder makes both topological decisions on the structure of T as well as numerical decisions about the evaluation of T at given observation points. Thus there are two classes of decision variables: numerical variables v and structural variables w. For every node $s\in N$ and observation $h\in H$, $v_{sh}$ holds the value of the evaluation at the node and $w_{skh}$ holds the corresponding value at the $k^{th}$ subnode of s.

$r_s$ is the tree rank of a node s in V. Although rank is an integer value, the integrality of $r_s$ is enforced by linear constraints involving the binary structural variable $\sigma$, defined below. As such, $r_s$ can be defined as a continuous variable.

$\Delta_g$ is the description complexity of the mathematical expression g of the expression tree T, defined as $\Delta_g = |N| + |A|$, the sum of the number of nodes and the number of operators. This can be written as a function of the decision variables as $\Delta_g = \Sigma_{s\in V} \alpha_s + \Sigma_{s,t\in V} \sigma_{ts}$, using the binary parameters $\alpha$ and $\sigma$ defined below. One goal is to minimize the description complexity of the discovered model $f$, and this goal may be accomplished by, e.g., limiting a number of occurrences of a given operator or by limiting a rank of the tree T.

The following structural variables are considered to be binary:

For each $s \in V$, $\alpha_s = 1$ if and only if $s \in N$ (i.e., s is part of the tree T).

For each $s \in V$, $\rho_s = 1$ if and only if s is the root node of T.

For each $s \in V$ and $d \leq D$, $\gamma_{sd} = 1$ if and only if s is a variable node (i.e., s=(var, i) for some $i \leq C_{var}$ and s is the variable representing the $d^{th}$ coordinate $x_d$. The vector $x = (x_1, \ldots, x_D)$ represents arguments of the function $f(x)$ to be modeled. The model is learned through multiple instances of $\chi = \{\chi_1, \ldots, \chi_h\}$. D is the number of arguments of $f(x)$, such that the vector x belongs to a space of dimension D. $x_d$ is therefore the $d^{th}$ coordinate of the vector x or, alternatively and equivalently, the $d^{th}$ argument of the function $f(x)=f(x_1, \ldots, x_D)$.

For each $s=(a, i)$, $t=(b, j) \in V$ and $k \leq K_b$, $\beta_{stk}=1$ if and only if s is the $k^{th}$ operand of t.

For each $s=(a, i)$, $t=(b, j) \in V$, $\sigma_{st}=1$ if and only if s is an operand of t.

The model is characterized by two sources of error: $\delta$ and $\varepsilon$. The former measures how well g approximates the unknown function $f$, while the latter is a set upper bound for the discrepancy between the modeled and measured output. $\varepsilon$ is defined by the user, to bound model fidelity (e.g., discrepancy between the true observations and those evaluated using the model). In some situations, the user may deliberately prescribe specific bounds to satisfy a desired confidence in an end-goal quantity, in other cases the user may determine such bound based upon a desired trade-off between affordable complexity and model error. In other cases the user may determine such bound based upon the budget of observations and the anticipated complexity of the model. The error $\delta$ has $\varepsilon$ as its upper bound, such that the global optimum for $f$ is defined with respect to description complexity $\Delta_g$, with driving $\delta$ down as a secondary priority. Provided $\varepsilon<1$, which can be enforced by setting an error metric $\mu$, and because $\Delta_g$ can only change by at least one unit at a time (the value difference in any binary decision variable $\alpha_s$), the two objectives can be scalarized to obtain the objective function min $\Sigma_{s \in V} \alpha_s + \delta$. $\mu$ is a measure of the model output error, used to quantify the pair-wise discrepancy between each data observation of a given input and the modeled output for the same input. The error model can be as simple as least squares difference, or alternatively harness more sophisticated statistical error measures if desired. Under the objective function, $\delta$ quantifies how well the model output predictions match the true data measurements, so that the objective function accounts for both model fidelity, through $\delta$, as well as model complexity, through $\alpha_s$.

The objective function is solved subject to a set of constraints. These constraints may include one or more of numerical value constraints, structural constraints, mixed constraints, and implied constraints. The constraints are not limited to those described herein, and it should be understood that those having ordinary skill in the art will be able to extend or restrict the set of constraints in a manner appropriate to their application.

Numerical constraints assign correct values of the nodes of the tree T, so that the v variables will obtain correct values for each input-output instance. An example of a numerical constraint is that, if an operator is a coefficient, its value must be the same over all of the observation points.

Structural constraints enforce rules regarding the structure of the tree T. Examples of structural constraints include:

$\Sigma_{s \in V} \rho_s = 1$ (the tree T has only one root node);

$\forall s \in V$, $\rho_s \leq \alpha_s$ (a root node is used);

$\forall q, s, t=(b,j) \in V$ and $k \leq K_b$, $\beta_{stk} \leq 1 - \rho_q$ (if the root is a leaf, then $g=x_d$ for some $d \leq D$ or g is a constant, in which case no arc exists between nodes);

$\forall s \in V$, $t=(b,j) \in L$, and $k \leq K_b$, $\beta_{stk}=0$ (for leaf operators with no children, the corresponding $\beta$ is zero);

$\forall s=(a, i) \in V$ and $k \leq K_b$, $\beta_{ssk}=0$ (the parent-child relationship is irreflexive);

$\forall s, t=(b,j) \in V$, $\Sigma_{k \leq K_b} \beta_{stk} \leq 1$ (an operand node is not matched to two different child nodes);

$\forall s, t=(b, j) \in V$, $k \leq K_b$ $\beta_{stk} \leq \alpha_s$ and $\forall s, t(b,j) \in V, k \leq K\_b$ $\beta \leq \alpha\_t$ (only match used nodes);

$$\forall s \in V \sum_{\substack{t=(b,j) \in V \\ t \notin L \cup \{s\}}} \sum_{k \leq K_b} \beta_{stk} \geq \alpha_s - \rho_s$$

(a used, non-root node must be matched to some parent (non-leaf) node other than itself);

$\forall s \in V \setminus \{var\}$, $d \leq D$ $\gamma\_sd=0$ (only match {var} operator nodes to data points);

$\forall i \leq C_{\{var\}} \Sigma_{d \leq D} \gamma_{\{(var,i),d\}} \geq \alpha_{(var,i)}$ (each {var} operator is matched to at least one data component if used);

$\forall d \leq D$ $\Sigma_{i \leq C_{\{var\}}} \gamma_{\{(var,i),d\}} \geq 1$ (each observation point is attached to at least one {var} node);

$\forall s, t \in V$ $\sigma_{st} \leq 1 - \alpha_s$ (root nodes cannot be child nodes);

$\forall s, t \in L$ $\sigma_{st}=0$ (leaf nodes cannot be in a parent-child relationship with one another);

$$\forall s \in V \sum_{\substack{t \in V \\ t \neq s}} \sigma_{ts} \geq \rho_s$$

(the root node is a parent node);

$\forall i \leq C_{\{var\}} \Sigma_{t \in V \setminus L}$ $\sigma_{(var,i),t} = \alpha_{(\{var\},i)}$ (every used {var} node is a child of a non-leaf node);

$\forall s \in V \setminus L, t=(b,j) \in V$, $k \leq K_b$ $\beta_{stk} \leq \sigma_{St}$ and $\forall s \in V \setminus L$, $t=(b,j) \in V$ $\Sigma_{k \leq K_b} \beta_{stk} \geq \sigma_{st}$ (projection of $\beta$ variables on $\sigma$ variables);

$\forall s \in V$ $r_s \leq (1-\rho_s)|V|$ (the rank of the root node is zero);

$\forall s \in V$ $r_s \leq \alpha_s |V|$ (the rank of unused nodes is zero); and $\forall s, t \in V$ $r_s+1-(1-\sigma_{st})(|V|+1) \leq r_t \leq r_s+1+(1-\sigma_{st})(|V|+1)$ (if t is the parent of s, then its rank is the rank of s plus 1).

Mixed constraints include features of numerical constraints and structural constraints. For example:

$\forall s \in V, t(b,j) \in V$, $k \leq K_b$, $h \in H$ $\beta_{stk}(v_{sh}-w_{tkh})=0$ (numerical values of nodes stored in v and w variables are equal if there is a parent-child relationship in the respective indices); and $\forall d \leq D$, $h \in H, i \leq C_{\{var\}} \gamma_{\{(\{var\},i),d\}}(v_{(\{var\},i),h}-\chi_d^h)=0$ (numerical values of {var} nodes stored in v are equal to observation points if the {var} node is assigned to the corresponding coordinate.

Some constraints are implied by the structure of a tree and mathematical expressions. For example, no node can be its own parent, and no sub-expression of the form $x_d-x_d$ can ever appear in g.

Solving the objective function (min $\Sigma_{s \in V} \alpha_s + \delta$) subject to one or more constraints produces a mathematical expression $f$ that represents a fit to the observational data H. This mathematical program represents model discovery, and finding the globally optimal solution produces the discovered model. This solution can be discovered using conventional solver software, either off-the-shelf or specially designed for this purpose.

Figure 2:
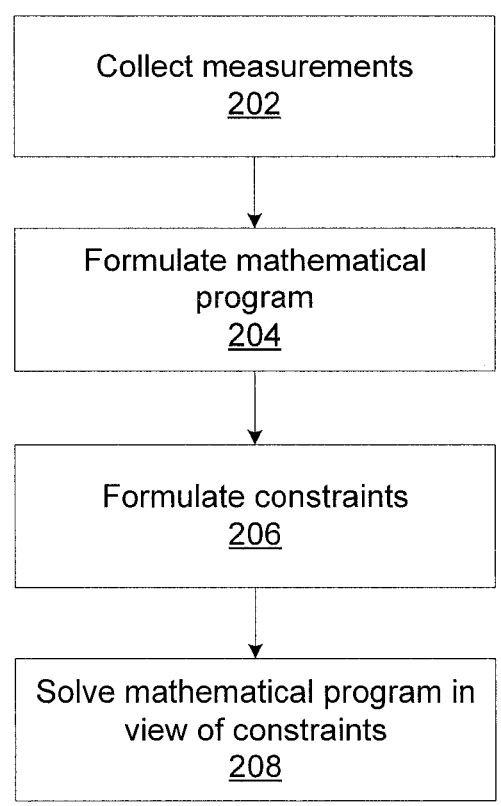
FIG. 2 is a block/flow diagram of a method for automatic model discovery in accordance with the present principles.

Referring now to FIG. 2, a method for discovering a model is shown. Block 202 collects a set of measurements, including whatever inputs were used to generate the measurements. Block 204 Formulates the mathematical program as described above, establishing a set of parameters and an objective function. Block 206 formulates the constraints on the objective function according to one or more structural, numerical, mixed, and/or implied constraints. Block 208 solves the mathematical program in view of the constraints. This solution can be performed using, e.g., an off-the-shelf solver.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Figure 3:
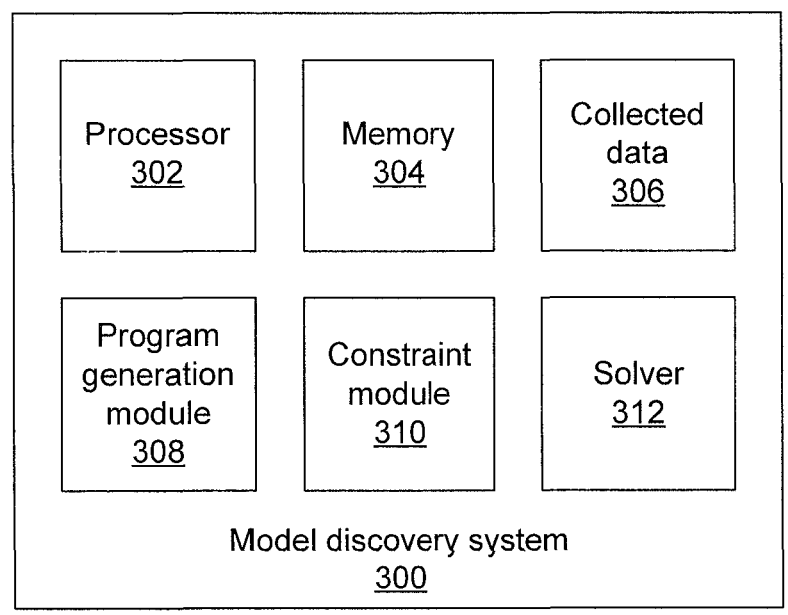
FIG. 3 is a block diagram of a method for automatic model discovery in accordance with the present principles.

Referring now to FIG. 3, a system 300 for model discovery is shown. The system 300 includes a hardware processor 302 in communication with memory 304. The memory 304 stores a set of observational data points 306. A program generation module 308 generates a mathematical program that represents parameters for finding a model to fit the collected data 306. A constraint module 310 includes or creates a set of constraints appropriate to the mathematical program. A solver 312 executes the mathematical program, optimizing the objective function in view of the constraints to find the model $f$ that best fits the collected data 306.

Having described preferred embodiments of a system and method for automated model discovery from limited data (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method for performing predictions with automatically discovered models, comprising:
  forming a mathematical program based on a set of observational data from a physical system to generate an objective function $\Sigma_{s \in V} \alpha_s + \delta$, where s is a node in a set of possible nodes V, $\alpha_s$ is a binary parameter that represents whether the node s is present in an expression tree, and $\delta$ is a measure of model complexity that includes a maximum number of operators in a model and a respective maximum number for each operator in the model that represents a number of times that the operator can appear in the model, wherein the objective function captures a fidelity of model predictions to observations, and to generate one or more constraints, wherein the mathematical program represents a model space as the expression tree comprising operators and operands, wherein the operators include variables, coefficients, and mathematical operations and the constraints include numerical constraints, which assign correct values of nodes of the expression tree to produce correct values for each input, structural constraints, which enforce rules regarding the structure of the expression tree, and mixed constraints, represented by both continuous and integer variables;
  solving the mathematical program by minimizing the objective function, subject to the one or more constraints, to determine the model in the model space, including a functional form and parameters of the model with a minimal complexity, that best fits the set of observational data; and
  predicting future behavior of the physical system using the determined model.

2. A computer readable storage medium comprising a computer readable program for performing predictions with automatically discovered models, wherein the computer readable program when executed on a computer causes the computer to perform the steps of:
  forming a mathematical program based on a set of observational data from a physical system to generate an objective function $\Sigma_{s \in V} \alpha_s + \delta$, where s is a node in a set of possible nodes V, $\alpha_s$ is a binary parameter that represents whether the node s is present in an expression tree, and $\delta$ is a measure of model complexity that includes a maximum number of operators in a model and a respective maximum number for each operator in the model that represents a number of times that the operator can appear in the model, wherein the objective function captures a fidelity of model predictions to observations, and to generate one or more constraints, wherein the mathematical program represents a model space as the expression tree comprising operators and operands, and wherein the operators include variables, coefficients, and mathematical operations and the constraints include numerical constraints, which assign correct values of nodes of the expression tree to produce correct values for each input, structural constraints, which enforce rules regarding the structure of the expression tree, and mixed constraints, represented by both continuous and integer variables;
  solving the mathematical program by minimizing the objective function, subject to the one or more constraints, to determine the model in the model space, including a functional form and parameters of the model with a minimal complexity, that best fits the set of observational data; and
  predicting future behavior of the physical system using the determined model.

3. A system for performing predictions with automatically discovered models, comprising:
  a mathematical program generation module comprising a processor configured to form a mathematical program based on a set of observational data from a physical system to generate an objective function $\Sigma_{s \in V} \alpha_s + \delta$, where s is a node in a set of possible nodes V, $\alpha_s$ is a binary parameter that represents whether the node s is present in an expression tree, and $\delta$ is a measure of model complexity that includes a maximum number of operators in model and a respective maximum number for each operator in the model that represents a number of times that the operator can appear in the model, wherein the objective function captures a fidelity of model predictions to observations, and to generate one or more constraints, wherein the mathematical program represents a model space as the expression tree comprising operators and operands, and wherein the operators include variables, coefficients, and mathematical operations and the constraints include numerical constraints, which assign correct values of nodes of the expression tree to produce correct values for each input, structural constraints, which enforce rules regarding the structure of the expression tree, and mixed constraints, represented by both continuous and integer variables;
a solver configured to solve the mathematical program by minimizing the objective function subject to the one or more constraints to determine the model in the model space, including a functional form and parameters of the model with a minimal complexity, that best fits the set of observational data and to predict future behavior of the physical system using the determined model.

* * * * *